United States Patent
Rohde et al.

(10) Patent No.: US 6,615,031 B1
(45) Date of Patent: Sep. 2, 2003

(54) HETERODYNE STAGE FOR HIGH-FREQUENCY RECEIVERS

(75) Inventors: Ulrich L. Rohde, 52 Hillcrest Dr., Upper Saddle River, NJ (US) 07458; Klaus Danzeisen, Graefelfing (DE)

(73) Assignee: Ulrich L. Rohde, Upper Saddle River, NJ (US)

( * ) Notice: Subject to any disclaimer, the term of this patent is extended or adjusted under 35 U.S.C. 154(b) by 0 days.

(21) Appl. No.: 09/568,033

(22) Filed: May 10, 2000

(30) Foreign Application Priority Data

May 10, 1999 (DE) .......................................... 199 21 438

(51) Int. Cl.[7] .............................. H04B 1/26; H04B 15/00

(52) U.S. Cl. ................ 455/313; 455/193.2; 455/195.1; 455/296

(58) Field of Search ................................. 455/313, 296, 455/193.2, 195.1, 191.1, 197.3

(56) References Cited

PUBLICATIONS

Meinke/Grundlach, Taschenbuch der Hochfrequenztechnik, 5th Edition, p. Q22 Figure 8.
Peter Vizmuller, RF Design Guide–Systems, Circuits and Equations, Artech House Publishers, 1st Edition, p. 165 (1995).

*Primary Examiner*—Edward F. Urban
*Assistant Examiner*—Temica M. Davis
(74) *Attorney, Agent, or Firm*—Birch, Stewart, Kolasch & Birch, LLP

(57) ABSTRACT

In a heterodyne stage having a separating filter providing broadband termination for an output of a mixer, a resistance having the value of a system impedance is arranged between the separating filter and a following intermediate-frequency filter, the resistor being interconnected with a resonance element tuned to the intermediate frequency in such a way that the resistor, at the intermediate frequency, has minimal attenuation of the useful signal and, at all other frequencies, terminates the output of the mixer with the system impedance.

7 Claims, 3 Drawing Sheets

| CASE | IMPEDANCE INVERTER I2 | RESONANCE ELEMENT KE ORIENTATION | | RESONANCE ELEMENT KE IN CUTOFF REGION | | IMPEDANCE INVERTER I1 | IF-FILTER IN CUTOFF REGION | |
|---|---|---|---|---|---|---|---|---|
| | | LENGTHWISE | LATERAL | HIGH OHMIC | LOW OHMIC | | HIGH OHMIC | LOW OHMIC |
| 1 | — | x | | | x | — | | |
| 2 | — | x | | x | | — | x | |
| 3 | x | x | | x | | — | | x |
| 4 | x | x | | | x | — | x | |
| 5 | — | | x | x | | x | | x |
| 6 | — | | x | | x | x | x | |
| 7 | x | | x | x | | x | | x |
| 8 | x | | x | | x | x | x | |

Fig. 1

HETERODYNE STAGE FOR HIGH-FREQUENCY RECEIVERS

BACKGROUND OF THE INVENTION

This invention relates to a heterodyne stage for high-frequency receivers of a type including a mixer with an output thereof having a broadband terminating separating filter and an intermediate-frequency filtered.

All materials from the priority application, German Patent Application 199 21 438.7, filed Mar. 10, 1999, is incorporated by reference herein.

Broadband terminating separating filters are known as so called diplexers. A broadband termination of a mixer output, independent of an input resistance of an IF filter, in a transmission region as well as in a cutoff region, has been, until now, possible only with relatively high circuit complexity, using several quartz crystal filters and broadband phase rotation circuits (Meinke/Grundlach, *Taschenbuch der Hochfrequenztechnik,* 5edition, page Q22, FIG. 8).

An object of this invention is to provide a heterodyne stage in which, with minimal circuit complexity, a mixer is continuously terminated with a system impedance, and which has minimal transmission attenuation.

SUMMARY OF THE INVENTION

This object is achieved in a heterodyne stage of the type mentioned in the opening paragraph above by using a resistance having a value of a system impedance arranged between a separating filter and an intermediate-frequency filter, with the resistance being interconnected with a resonance element tuned to the intermediate frequency in such a manner that the resistance, at the intermediate frequency, has minimal attenuation for a useful signal and, at all other frequencies, terminates the output of the mixer with the system impedance.

The heterodyne stage of this invention ensures that, with minimal circuit complexity, the mixer output is loaded with the system impedance, not only in the transmission region, but also in the entire cutoff region, generally at 50 Ohms. Topographically, depending on the impedance behavior of the IF filter and a compensation element with the two circuit variants—series resistance or shunt resistance—a total of eight circuit options results, as shown in the table of FIG. 1. Depending on whether the IF filter acts as a series circuit (low impedance in the transmission region, high impedance in the cutoff region) or as a parallel circuit (high impedance in the transmission region, low impedance in the cutoff region), and depending on whether a resonance element working in cooperation with the resistance acts as a series circuit or a parallel circuit, appropriate impedance inverters must be connected therebetween that are constructed in a known manner, for example of discrete components, and having a behavior of a λ/4 line, that is creating a low-ohmic impedance from a high-ohmic impedance, and vice versa. The resonance element is made to be free from parasitic resonances using known measures, and its impedance level can be transformed accordingly with aid of a transformation circuit, that is, with an additional transformation circuit the impedance level of the resonance element can be multiplied or divided by a constant factor, depending on whether the ohmic resistance that terminates the separating filter output is a series resistance or a parallel resistance.

BRIEF DESCRIPTION OF THE DRAWING

The invention is described and explained in more detail below using embodiment shown in the drawings. The described and drawn features of the invention can be used individually or in preferred combinations in other embodiments. The foregoing and other objects, features and advantages of the invention will be apparent from the following more particular description of preferred embodiments of the invention, as illustrated in the accompanying drawing in which reference characters refer to the same parts throughout the different views. The drawing is not necessarily to scale, emphasis instead being placed upon illustrating principles of the invention in a clear manner.

FIG. 1 is a table illustrating features of different embodiments of the invention;

FIG. 2 shows a schematic circuit diagram of a conventional heterodyne stage, as it is used in a high-frequency receiver, for example. An input signal E is converted into an intermediate frequency (IF) in a mixer 1, such as a passive ring mixer, using the frequency of a local, mixer, oscillator 2. An output of the mixer 1 is terminated by a broadband separating filter 3 (duplexer or diplexer). In this known arrangement, a second sideband of higher received frequencies that arises during mixing finds a real termination with a system impedance, but low received frequencies (other than the frequency zero), by contrast, find a complex termination that differs from the system impedance. The separating filter 3 can include a combination of high-pass and low-pass filters or band-pass with band cutoff and termination, load, corresponding to the system impedance, as described, for example, in Detlef Lechner, *Kurzwellenemfanger*[Shortwave Receivers], Military Publishers of the German Democratic Republic, $2^{nd}$ Edition, p. 118–119.

Figure 2:
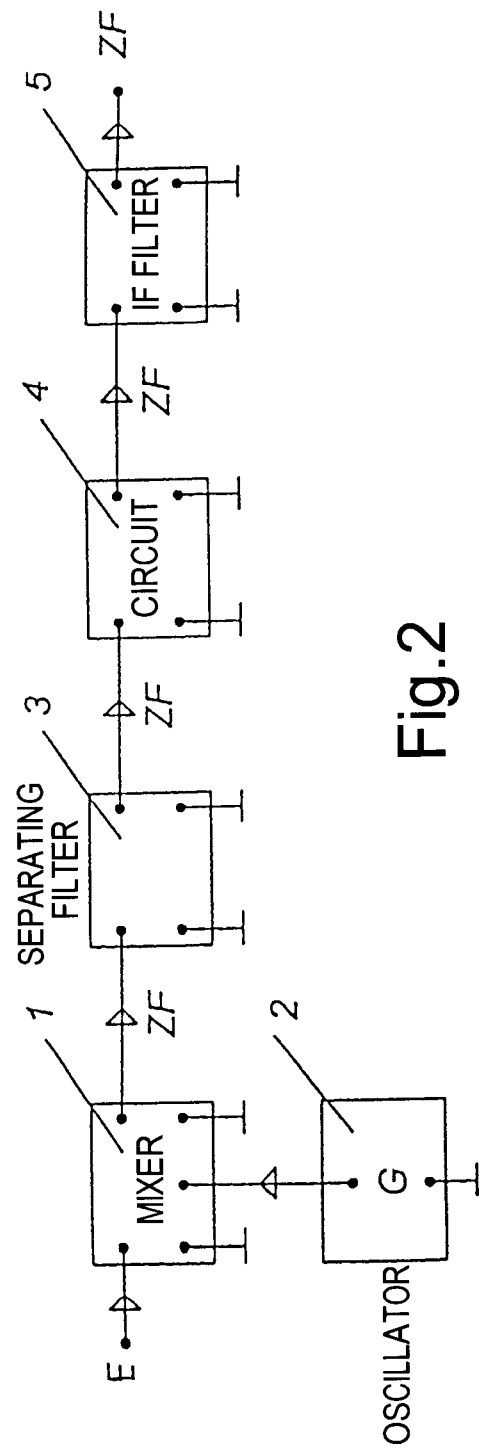
FIG. 2 is a schematic circuit diagram of a conventional heterodyne stage with a circuit added thereto for this invention.
Figure 3:
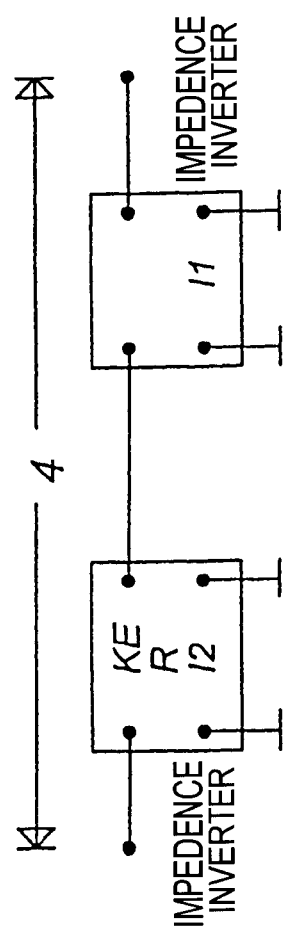
FIG. 3 is a schematic circuit diagram of the circuit added to the heterodyne stage of FIG. 2 for this invention.

If an intermediate-frequency filter 5 is directly connected via the broadband separating filter 3 to the output of the mixer 1, dynamic properties of the mixer are negatively affected when driven near the intermediate frequency by greatly changing impedance behavior of the filter. To prevent this, a circuit 4 is added between the separating filter 3 and the IF filter 5 which could have one of various topologies, according to the table in FIG. 1, depending on unchangeable parameters of the remaining circuitry, but always producing the same result. The circuit 4, according to FIG. 3, includes a maximum of one resonance element KE, an ohmic resistance R of the value of the system impedance, and a maximum of two impedance inverters I1 and I2. The respective combinations of these elements are presented in the table according to FIG. 1.

Figure 4:
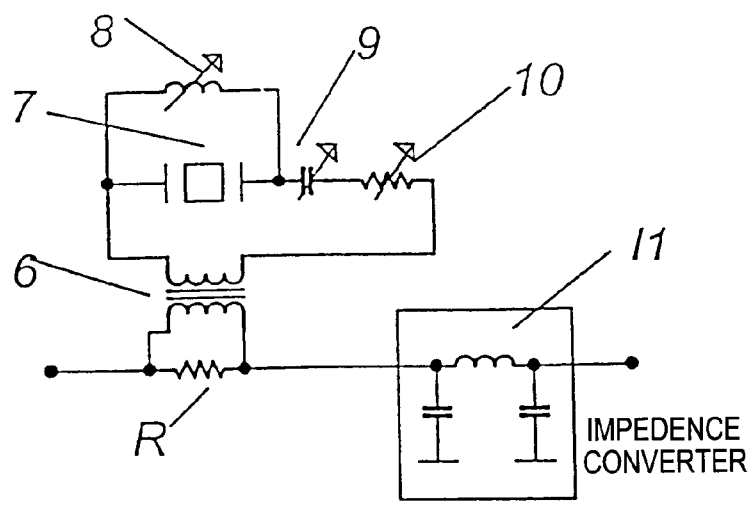
FIG. 4 is a more detailed schematic circuit diagram of the circuit of FIG. 3.

FIG. 4 shows a first embodiment for a heterodyne stage of this invention and indeed for a high-quality high-frequency receiver that is driven by an input frequency E ranging from 0 to 30 MHz, that has an intermediate frequency IF of 80 MHz, and that has an IF filter 5 with series circuit behavior. A single quartz crystal 7 having a series circuit behavior is used as the resonance element KE. A resistance R is arranged in series between the separating filter 3 and the IF filter 5.

This embodiment of FIG. 4 corresponds to Case 5 in the table.

The IF filter 5 is, for example, structured as a multipolar crystal filter and is adjusted to the IF center frequency. Preferably a quartz-crystal filter with crystals of high unloaded Q, and thus minimal passband attenuation, is used, this being achieved, for example, with quartz crystals in the fifth overtone. A characteristic of such filters is that in the pass region they have a real input resistance of almost the value of the system impedance, such as 50 Ohms, but in the cutoff region they have increasingly high-ohmic impedance with a decreasing real portion. Since, in this embodiment, there should be compensation with the series resistance R, this input impedance of the IF filter must be inverted from high-ohmic to low-ohmic. To that end, an impedance converter I1 is coupled therebetween, which is structured as a λ/4 converter of discrete components, as described, for example, in Peter Vizmuller, *RF Design Guide-Systems, Circuits and Equations*, Artech House Publishers, 1$^{st}$ Edition 1995, p. 165.

The single quartz crystal 7 tuned to the IF center frequency is connected parallel to the ohmic series resistance R via an impedance transformer 6. With an adjustable parallel inductance 8, an interfering parallel capacitance can be compensated; with an adjustable series condenser 9, the center frequency can be fine-tuned; and with an adjustable series resistance 10, the operating quality can be fine-tuned at a cost of a somewhat higher pass attenuation. A turns ratio of the transformer 6 largely determines operating quality of transmission in the series arm.

The single quartz crystal 7, at a series resonance frequency, has a low impedance, which is determined mainly through its loss resistance. This low impedance in the pass region is stepped down even further via the transformer 6, and is connected in parallel to the resistance R as an extremely low value, that is, the resistance R is practically shorted at the IF center frequency, and thereby loses its attenuating effect. At all frequencies other than the center frequency, the quartz crystal is very high-ohmic and the resistance R is again increasingly effective as a terminating resistance for the separating filter 3. This applies for frequencies immediately near the pass region of the IF filter 5. For greater frequency deviations from the center frequency, the separating filter 3 functions as a conventional termination for the mixer 1.

Through an uncomplicated arrangement of a series resistance R and a single quartz crystal 7, therefore, in a broadband manner, a constant termination of the mixer with the system impedance is achieved, and thus a constant conversion attenuation as well as a constant intermodulation behavior, independent of a position of the intermodulation-creating signal. For even more stringent requirements, a quartz crystal filter comprising several quartz crystals can be used instead of a single quartz crystal. The broadband separating filter 3 can be structured of commercially available capacitors and coils, since the small unloaded Q in the arrangement of this invention is not of further significance.

Figure 5:
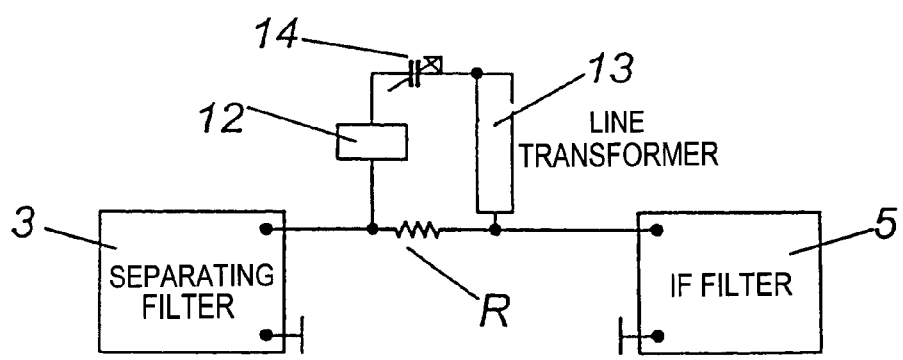
FIG. 5 is a more detailed schematic circuit diagram of a second embodiment of the circuit of FIG. 3, with a parallel intermediate-frequency filter of the heterodyne stage.

FIG. 5 shows an embodiment for a high-quality spectrum analyzer having an input frequency E ranging from 0 to 3 GHz, for example, an intermediate frequency IF of 4 GHz, and an IF filter 5 having a parallel circuit operation. In this case, a ceramic single resonator 12, in a parallel circuit operation, is used as a resonance element KE, and again an ohmic series resistance R connected between the filter and IF filters. This corresponds to Case 4 of the table in FIG. 1. The series circuit of the resonator 12 with a λ/4 line transformer 13 spans the ohmic resistance R; also here a series condenser 14 can be interposed for compensation purposes. Therewith, at the intermediate frequency, the resistance R is again shorted, and is effective at frequencies deviating therefrom, respectively with its value corresponding to the system impedance. The operating quality can be appropriately adjusted by modifying the length of the λ/4 line.

Figure 6:
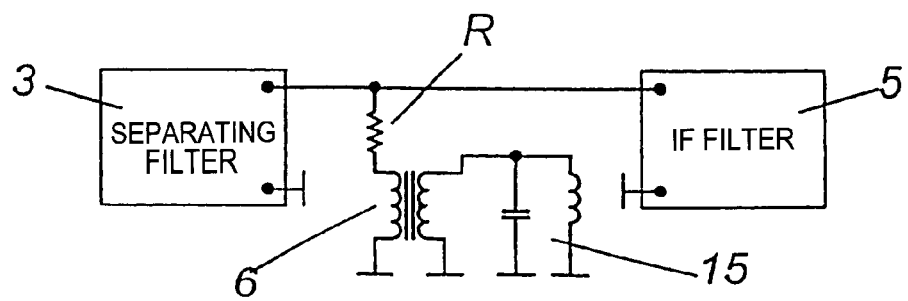
FIG. 6 is a schematic circuit diagram of a third embodiment similar to the FIG. 3 embodiment, but with an ohmic resistance connected in parallel.

FIG. 6 shows a possibility of an ohmic resistance R connected in parallel to the output of the separating filter 3, which ohmic resistance is connected in series to a primary winding of an impedance transformer 6. A secondary winding of the impedance transformer 6 is connected to an oscillating circuit 15 tuned to the intermediate frequency. Therefore, a high-ohmic resistance connected in series to the resistance R is effective at the intermediate frequency. This embodiment corresponds to Case 1 of the table according to FIG. 1.

The invention claimed is:

1. A heterodyne stage including a mixer (1) with an output thereof having a broadband terminating separating filter (3) and an intermediate-frequency filter (5), wherein a resistance (R) having a value of a system impedance is arranged between the separating filter (3) and an intermediate-frequency filter (5), with the resistance being interconnected with a resonance element (KE, 7, 12) tuned to an intermediate frequency in such a manner that the resistance, at the intermediate frequency, has minimal attenuation for a useful signal and, at all other frequencies, terminates the output of the mixer (1) with the system impedance.

2. A heterodyne stage as in claim 1, wherein an impedance inverter (I1, I2) is arranged between the intermediate-frequency filter (5) and the resistance (R) and/or between the resonance element (KE, 7, 12) and the resistance (R).

3. A heterodyne stage as in claim 1, wherein the resonance element is a quartz crystal (7) tuned to the intermediate frequency.

4. A heterodyne stage as in claim 3, wherein the quartz crystal (7) is connected in parallel to the resistance (R) via a transformer (6).

5. A heterodyne stage as in claim 1, wherein the intermediate-frequency filter (5) is high-ohmic in a cut off region and an impedance convertor (I1) having a behavior of a λ/4 line is arranged between the resistance (R) and the intermediate-frequency filter (5).

6. A heterodyne stage as in claim 1, wherein the resonance element is a ceramic resonator (12) connected in series with a λ/4 line parallel to the resistance (R) that is arranged in series between the separating filter (3) and the IF filter (5).

7. A heterodyne stage as in claim 1, wherein the resistance (R) is arranged parallel to an output of the separating filter (3) and the resonance element (KE) has parallel resonance properties and is connected via an impedance transformer in series to the resistance (R).

* * * * *